(12) United States Patent
Brazis et al.

(10) Patent No.: US 7,355,225 B2
(45) Date of Patent: Apr. 8, 2008

(54) SEMICONDUCTOR DEVICE AND METHOD FOR PROVIDING A REDUCED SURFACE AREA ELECTRODE

(75) Inventors: Paul W. Brazis, South Elgin, IL (US); Daniel R. Gamota, Palatine, IL (US); Krishna Kalyanasundaram, Elmhurst, IL (US); Jie Zhang, Buffalo Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/258,634

(22) Filed: Oct. 26, 2005

(65) Prior Publication Data
US 2007/0094624 A1   Apr. 26, 2007

(51) Int. Cl.
*H01L 29/76* (2006.01)

(52) U.S. Cl. ............... 257/288; 257/347; 257/E21.176; 257/E29.116; 438/142; 438/159

(58) Field of Classification Search ............... 257/288, 257/347, E29.116, E29.117, E21.176; 438/142, 438/149, 151, 159
See application file for complete search history.

(56) References Cited

U.S. PATENT DOCUMENTS

| 6,707,107 | B2* | 3/2004 | Kido ........................... 257/354 |
| 6,853,406 | B2* | 2/2005 | Lee et al. ...................... 349/43 |
| 6,867,081 | B2* | 3/2005 | Weng et al. ................. 438/197 |
| 7,019,328 | B2* | 3/2006 | Chabinyc et al. ............. 257/40 |
| 7,112,463 | B2* | 9/2006 | Horning et al. ............... 438/52 |
| 2007/0020883 | A1* | 1/2007 | Arias et al. ................. 438/455 |

* cited by examiner

*Primary Examiner*—T. N. Quach

(57) ABSTRACT

An apparatus (200) such as a semiconductor device comprises a gate electrode (201) and at least a first electrode (202). The first electrode preferably has an established perimeter that at least partially overlaps with respect to the gate electrode to thereby form a corresponding transistor channel. In a preferred approach the first electrode has a surface area that is reduced notwithstanding the aforementioned established perimeter. This, in turn, aids in reducing any corresponding parasitic capacitance. This reduction in surface area may be accomplished, for example, by providing openings (203) through certain portions of the first electrode.

19 Claims, 1 Drawing Sheet

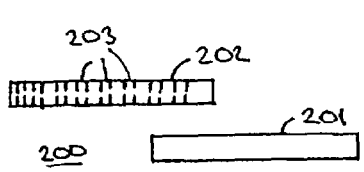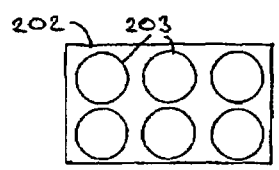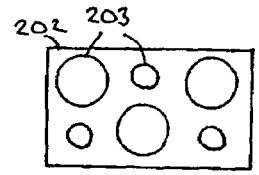
FIG. 2    FIG. 3    FIG. 4
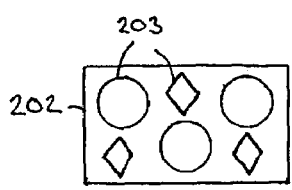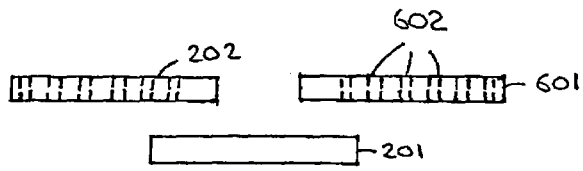
FIG. 5    FIG. 6
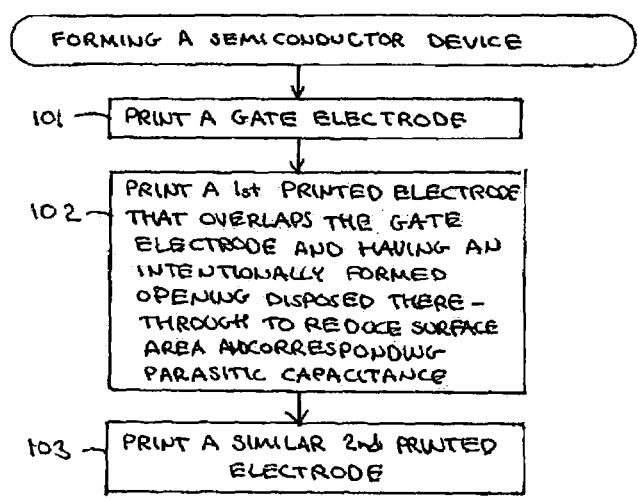
FIG. 1

SEMICONDUCTOR DEVICE AND METHOD FOR PROVIDING A REDUCED SURFACE AREA ELECTRODE

TECHNICAL FIELD

This invention relates generally to semiconductor devices, including but not limited to printed semiconductor devices.

BACKGROUND

Wafer fabrication methods and apparatus that use such techniques as vacuum deposition to form semiconductor-based devices of various kinds are well known. Such techniques serve well for many purposes and can achieve high reliability, small size, and relative economy when applied in high volume settings. Recently, other techniques are being explored to yield semiconductor-based devices. For example, organic or inorganic semiconductor materials can be provided as a functional ink and used in conjunction with various printing techniques to yield printed semiconductor devices.

Printed semiconductor devices, however, yield considerably different end results and make use of considerably different fabrication techniques than those skilled in the art of traditional semiconductor manufacturing are prone to expect. For example, printed semiconductor devices tend to be considerably larger than typical semiconductor devices that are fabricated using more traditional techniques. As other examples, both the materials employed and the deposition techniques utilized are also well outside the norm of prior art expectations.

Due in part to such differences, semiconductor device printing gives rise to challenges and difficulties that are without parallel in prior art practice. As one example, printed transistors (such as field effect transistors) are typically formed by printing successive layers of inks on top of one another to form the completed device. Each layer is typically defined by a plate, screen, or other patterning technique known in the printing industry. In general, these successive layers align with one another, but typically only within some corresponding tolerance. The printing industry sometimes refers to such layer alignment tolerance as layer-to-layer registration. The printing industry typically accommodates such registration issues by ensuring overlap between such layers.

In the case of a transistor channel, the channel typically needs to be aligned over a gate electrode such that no part of the channel resides unaligned with the gate electrode. Traditional silicon wafer fabrication techniques often employ a self-aligning gate technique to effectively reduce such non-alignment to zero. Masks are used to effect this technique, however, and thus are not useful in a printing context. To meet this requirement, typical printing techniques would suggest increasing the size of the gate region to ensure such a result consistent with expected registration tolerances. This, however, unfortunately also requires overlap between the gate electrode and the other electrodes of the transistor (such as the drain electrode and the source electrode). And this, in turn, gives rise to undesirable parasitic capacitances that slow down the switching time of the transistor itself.

Unfortunately, various proposed solutions to this problem are not without significant issues themselves. For example, by one approach, one might simply try to improve layer-to-layer registration. Such a solution, however, may be prohibitively costly and or may require presently unachievable modifications of the printing platform itself. As another example, one might seek to reduce the dielectric constant of a dielectric material that separates the gate electrode from the other electrodes. This approach, however, will also tend to reduce the desirable capacitance that one seeks to establish between the gate electrode and the semiconductor channel, thereby reducing current flow and potentially raising operating voltage requirements.

BRIEF DESCRIPTION OF THE DRAWINGS

The above needs are at least partially met through provision of the semiconductor device and method for providing a reduced surface area electrode described in the following detailed description, particularly when studied in conjunction with the drawings, wherein:

FIG. 1 comprises a flow diagram as configured in accordance with various embodiments of the invention;

FIG. 2 comprises a side elevational schematic view as configured in accordance with various embodiments of the invention;

FIG. 3 comprises a top plan schematic view as configured in accordance with various embodiments of the invention;

FIG. 4 comprises a top plan schematic view as configured in accordance with various embodiments of the invention;

FIG. 5 comprises a top plan schematic view as configured in accordance with various embodiments of the invention; and FIG. 6 comprises a side elevational schematic view as configured in accordance with various embodiments of the invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Generally speaking, pursuant to these various embodiments, an apparatus such as a semiconductor device comprises a gate electrode and at least a first electrode. The first electrode preferably has an established perimeter that at least partially overlaps with respect to the gate electrode to thereby form a corresponding transistor channel (typically in conjunction, of course, with one or more other electrodes). In a preferred approach the first electrode has a surface area that is reduced notwithstanding the aforementioned established perimeter. This, in turn, aids in reducing corresponding parasitic capacitance.

In a preferred embodiment the surface area of the first electrode is reduced by providing openings therethrough.

These openings may be of a similar size and/or shape to one another or may be different. In general, and as a preferred approach, these openings are formed distal to the transistor channel.

Also in a preferred embodiment the elements of the transistor, including at least the gate electrode and the first electrode, comprise printed elements. So configured, these teachings permit the use of electrodes (such as drain electrodes and source electrodes) having an increased size in order to accommodate layer-to-layer registration needs of a given application setting while also reducing the effective surface area of such electrodes. This, in turn, reduces the overall parasitic capacitance of the resultant device without typically reducing the effective channel width of the device. Accordingly, improved device switching speeds can be expected without concurrent improvements with respect to print resolution, reduction of the channel length, improved semiconductor mobility, or the like. These teachings are well accommodated by existing technologies and comprise an economical solution as well.

These and other benefits will become more evident to those skilled in the art upon making a thorough review and study of the following detailed description. Referring now to the drawings, and in particular to FIG. 1, an overall process 100 representative of these various teachings comprises printing 101 a gate electrode on, for example, a substrate of choice. The substrate can comprise any suitable material including various rigid and non-rigid materials. In a preferred embodiment, the substrate comprises a flexible substrate comprised, for example, of polyester or paper. The substrate can be comprised of a single substantially amorphous material or can comprise, for example, a composite of differentiated materials (for example, a laminate construct). In a typical embodiment the substrate will comprise an electrical insulator though for some applications, designs, or purposes it may be desirable to utilize a material (or materials) that tend towards greater electrical conductivity.

This process 100 also provides for printing 102 a first printed electrode that at least partially overlaps with respect to the gate electrode to thereby form a corresponding transistor channel, wherein the first printed electrode has at least one intentionally formed opening disposed therethrough to thereby reduce a surface area of the first printed electrode and thereby reduce corresponding parasitic capacitance.

The above-described device elements are preferably, though not necessarily, comprised of one or more inks including, for example, inks that comprise semiconductor material. Those skilled in the printing arts are familiar with both graphic inks and so-called functional inks (wherein "ink" is generally understood to comprise a suspension, solution, or dispersant that is presented as a liquid or paste, or a powder (such as a toner powder). These functional inks are further comprised of metallic, organic, or inorganic materials having any of a variety of shapes (spherical, flakes, fibers, tubes) and sizes ranging, for example, from micron to nanometer. Functional inks find application, for example, in the manufacture of some membrane keypads. Though graphic inks can be employed as appropriate in combination with this process 100, these inks are more likely, in a preferred embodiment, to comprise a functional ink.

In a preferred approach, such inks are placed on the substrate by use of a corresponding printing technique. Those familiar with traditional semiconductor fabrication techniques such as vacuum deposition will know that the word "printing" is sometimes used loosely in those arts to refer to such techniques. As used herein, however, the word "printing" is used in a more mainstream and traditional sense and does not include such techniques as vacuum deposition that involve, for example, a state change of the transferred medium in order to effect the desired material placement. Accordingly, "printing" will be understood to include such techniques as screen printing, offset printing, gravure printing, xerographic printing, flexography printing, inkjetting, microdispensing, stamping, and the like. It will be understood that these teachings are compatible with the use of a plurality of such printing techniques during fabrication of a given element such as a semiconductor device. For example, it may be desirable to print a first device element (or portion of a device element) using a first ink and a first printing process and a second, different ink using a second, different printing process for a different device element (or portion of the first device element).

For purposes of illustration and not by way of limitation, a transistor can be formed using such materials and processes as follows. A gate can be printed on a substrate of choice using a conductive ink of choice (such as but not limited to a functional ink containing copper or silver, such as DuPont's Ag 5028 combined with 2% 3610 thinner). Pursuant to one approach, air is blown over the printed surface after a delay of, for example, four seconds. An appropriate solvent can then be used to further form, define, or otherwise remove excess material from the substrate. Thermal curing at around 120 degrees Centigrade for 30 minutes can then be employed to assure that the printed gate will suitably adhere to the substrate.

A dielectric layer may then be printed over at least a substantial portion of the above-mentioned gate using, for example, an appropriate epoxy-based functional ink (such as, for example, DuPont's 5018A ultraviolet curable material). By one approach, the dielectric layer comprises a laminate of two or more layers. When so fabricated, each layer can be processed under an ultraviolet lamp before applying a next layer.

Additional electrodes are then again printed and cured using, for example, a copper or silver-based electrically conductive functional ink (such as, for example, DuPont's Ag 5028 with 2% 3610 thinner). These additional electrodes can comprise, for example, a source electrode and a drain electrode. A semiconductor material ink, such as but not limited to an organic or inorganic semiconductor material ink, is then printed to provide an area of semiconductor material that bridges a gap between the source electrode and the drain electrode.

Referring momentarily to FIG. 2, a gate electrode 201 and a first electrode 202 are shown and comprise a part of a corresponding semiconductor device 200 (where those skilled in the art will recognize that other layers and elements, such as a supporting substrate, a dielectric layer, a semiconductor layer, and so forth are not shown for the sake of simplicity and clarity). The first electrode 202 overlaps the gate electrode 201 in accordance with these teachings and further comprises, in this illustrative embodiment, a plurality of openings 203 disposed therethrough.

These openings 203 are preferably disposed distal to the transistor channel. Such openings 203 can be initially included during formation of the first electrode 202 or may be formed thereafter (by, for example, effecting removal of previously deposited or printed material) depending upon the preferences of the designer and/or the capabilities and/or limitations of a given manufacturing setting.

The openings 203 may be of substantially equal size with respect to one another (as suggested by the illustrative embodiment presented at FIG. 3) or may be of substantially unequal size with respect to one another (as suggested by the illustrative embodiment presented at FIG. 4). Those skilled in the art will understand that when using unequal sizes, any number of differing sizes may be used at the discretion of the designer. It will also be understood that these openings may all share a substantially equal shape with respect to one another (as suggested by the illustrative embodiments of FIGS. 3 and 4) or these openings may be of a substantially unequal shape with respect to one another (as suggested by the illustrative embodiment presented at FIG. 5 where some of the openings have a circular shape and some of the openings have a diamond shape).

The precise number of openings 203 (and their respective shapes and sizes) may vary considerably with respect to the application setting. In some cases, a 10 percent reduction of the surface area of the first electrode may be sufficient to achieve the desired performance. In other cases, a reduction of at least 50 percent of the surface area of the first electrode in the area of concern may be useful or even necessary to achieve the desired performance of the resultant device.

A typical transistor, of course, will usually have at least two electrodes in addition to a gate electrode. For example, a field effect transistor will typically have a source electrode and a drain electrode in addition to the gate electrode. Referring again to FIG. 1, this process 100 will further optionally support the printing 103 of additional electrodes. In a preferred approach these additional electrodes, such as a second printed electrode, are similar to the first printed electrode described above in that the additional electrode(s) also overlap the gate electrode and also have the intentionally formed openings disposed therethrough to reduce the surface area of the additional electrode(s) and thereby reduce corresponding parasitic capacitance.

To illustrate, and referring now to FIG. 6, a second electrode 601 have a plurality of openings 602 disposed therethrough can be positioned to overlap the gate electrode 201 such that the openings 602 are positioned distal to the resultant transistor channel. In such an embodiment, the first electrode 202 could comprise, for example, a source electrode and the second electrode 601 could comprise, for example, a drain electrode.

So configured, it will be readily apparent that the relatively oversized nature of the upper electrodes will accommodate a fair amount of mis-registration and still ensure that the gate electrode will be positioned beneath the transistor channel (i.e., the space between the two upper electrodes in these embodiments). At the same time, parasitic capacitance as would otherwise be associated with upper electrodes of this size is substantially ameliorated by the presence of the aforementioned openings that reduce (substantially if desired) the effective surface area of these electrodes.

Those skilled in the printing arts will appreciate that openings such as those described above are relatively easy to accomplish using present printing techniques, with some printing processes being perhaps better suited to the printing of specific shapes. For example, gravure printing might be particularly suited to printing diamond-shaped openings while another process might be better suited to providing a grid of circular-shaped openings. These teachings are usable with all such printing techniques as these teachings are not particularly sensitive to the precise shape of the openings.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

For example, instead of a plurality of openings as are illustrated in the drawings, a single large hole could be employed if desired.

We claim:

1. A semiconductor device comprising:
   a gate electrode having a perimeter;
   at least a first electrode that at least partially overlaps with respect to the gate electrode to thereby form a corresponding transistor channel, wherein the first electrode has at least one intentionally formed opening disposed therethrough and fully within the perimeter to thereby reduce a surface area of the first electrode and thereby reduce corresponding parasitic capacitance.

2. The semiconductor device of claim 1 wherein the at least one intentionally formed opening is disposed distal to the transistor channel.

3. The semiconductor device of claim 1 wherein the first electrode has a plurality of intentionally formed openings disposed therethrough to thereby reduce the surface area of the first electrode and thereby reduce corresponding parasitic capacitance.

4. The semiconductor device of claim 3 wherein the plurality of intentionally formed openings are of substantially equal size with respect to one another.

5. The semiconductor device of claim 3 wherein the plurality of intentionally formed openings are of substantially equal shape with respect to one another.

6. The semiconductor device of claim 3 wherein the plurality of intentionally formed openings are of substantially unequal size with respect to one another.

7. The semiconductor device of claim 3 wherein the plurality of intentionally formed openings are of substantially unequal shape with respect to one another.

8. The semiconductor device of claim 1 wherein the at least one intentionally formed opening comprises at least a 10 percent reduction of the surface area of the first electrode.

9. The semiconductor device of claim 8 wherein the at least one intentionally formed opening comprises at least a 50 percent reduction of the surface area of the first electrode.

10. The semiconductor device of claim 1 further comprising:
    at least a second electrode having a second perimeter that also at least partially overlaps with respect to the gate electrode to thereby further form the transistor channel, wherein the second electrode has at least one intentionally formed opening disposed therethrough and fully within the second perimeter to thereby reduce a surface area of the second electrode and thereby reduce corresponding parasitic capacitance.

11. The semiconductor device of claim 1 wherein the semiconductor device comprises a printed semiconductor device, the gate electrode comprise a printed gate electrode, and the first electrode comprises a first printed electrode.

12. A method of forming a semiconductor device comprising:
    printing a gate electrode having a perimeter;
    printing a first printed electrode that at least partially overlaps with respect to the gate electrode to thereby form a corresponding transistor channel, wherein the first printed electrode has at least one intentionally formed opening disposed therethrough and fully within the perimeter to thereby reduce a surface area of the first printed electrode and thereby reduce corresponding parasitic capacitance.

13. The method of claim 12 wherein printing a first printed electrode further comprises printing the first printed electrode to initially include the at least one intentionally formed opening disposed therethrough.

14. The method of claim 12 wherein printing a first printed electrode further comprises removed printed material to thereby form the at least one intentionally formed opening disposed therethrough.

15. The method of claim 12 wherein printing the first printed electrode comprises forming the at least one intentionally formed opening disposed therethrough distal to the transistor channel.

16. The method of claim 12 wherein printing the first printed electrode further comprises printing a first printed electrode that at least partially overlaps with respect to the gate electrode to thereby form a corresponding transistor channel, wherein the first printed electrode has a plurality of intentionally formed openings disposed therethrough to thereby reduce a surface area of the first printed electrode and thereby reduce corresponding parasitic capacitance.

17. The method of claim 12 further comprising:
    printing at least a second printed electrode having a second perimeter that also at least partially overlaps with respect to the printed gate electrode to thereby further form the transistor channel, wherein the second printed electrode has at least one intentionally formed opening disposed therethrough and fully within the second perimeter to thereby reduce a surface area of the second printed electrode and thereby reduce corresponding parasitic capacitance.

18. An apparatus comprising:
    a printed gate electrode;
    at least a first printed electrode having an established perimeter that at least partially overlaps with respect to the printed gate electrode to thereby form a corresponding transistor channel, wherein the first printed electrode comprises means to reduce a surface area of the first printed electrode notwithstanding the established perimeter to thereby reduce corresponding parasitic capacitance.

19. The apparatus of claim 18 wherein the means to reduce a surface area of the first printed electrode comprises at least one intentionally formed opening disposed through the first printed electrode.

* * * * *